(12) United States Patent  
Zhou

(10) Patent No.: US 11,043,160 B2  
(45) Date of Patent: Jun. 22, 2021

(54) COMMON-GATE TRANSISTOR, PIXEL CIRCUIT, DRIVING METHOD AND DISPLAY

(71) Applicant: EverDisplay Optronics (Shanghai) Co., Ltd., Shanghai (CN)

(72) Inventor: Xingyu Zhou, Shanghai (CN)

(73) Assignee: Everdisplay Optronics (Shanghai) Co., Ltd., Shanghai (CN)

(*) Notice: Subject to any disclaimer, the term of this patent is extended or adjusted under 35 U.S.C. 154(b) by 0 days.

(21) Appl. No.: 15/984,633

(22) Filed: May 21, 2018

(65) Prior Publication Data

US 2018/0342196 A1 Nov. 29, 2018

(30) Foreign Application Priority Data

May 23, 2017 (CN) .......................... 201710369938.4

(51) Int. Cl.
*G09G 3/32* (2016.01)
*H01L 27/12* (2006.01)
(Continued)

(52) U.S. Cl.
CPC ............. *G09G 3/32* (2013.01); *G09G 3/3233* (2013.01); *H01L 27/1214* (2013.01);
(Continued)

(58) Field of Classification Search
CPC ............. G09G 3/32; G09G 2320/0233; G09G 2320/045; G09G 2300/0819; G09G 3/3233; G09G 3/20; H01L 29/786; H01L 27/1214
See application file for complete search history.

(56) References Cited

U.S. PATENT DOCUMENTS 4,488,348 A * 12/1984 Jolly ................... H01L 21/8221  
257/369  
5,521,107 A * 5/1996 Yamazaki ............ G09G 3/3659  
438/303  
(Continued)

FOREIGN PATENT DOCUMENTS

CN 1949513 A 4/2007  
CN 101022112 A 8/2007  
(Continued)

OTHER PUBLICATIONS

Machine translation of KR 100543013 (Year: 2016).*  
(Continued)

*Primary Examiner* — Patrick N Edouard  
*Assistant Examiner* — Joseph P Fox  
(74) *Attorney, Agent, or Firm* — Qinghong Xu

(57) ABSTRACT

The disclosure discloses a common-gate transistor, a pixel circuit, a driving method and a display, including: a first doped region, a second doped region, a third doped region, a fourth doped region and a fifth doped region; the second doped region, the third doped region, the fourth doped region, and the fifth doped region are indirectly communicated through the first doped region, and the second doped region, the third doped region, and the fourth doped region, the fifth doped region and the first doped region are heterodoped respectively. The two transistors in the common-gate transistor share one gate doped region, i.e., the first doped region, which can not only save one gate doped region, but also can make the gates of the two transistors have the same electrical parameters, and then the cascode effect of the two transistors is more ideal.

5 Claims, 14 Drawing Sheets

(51) Int. Cl.
*H01L 29/786* (2006.01)
*G09G 3/3233* (2016.01)
(52) U.S. Cl.
CPC ... *H01L 29/786* (2013.01); *G09G 2300/0819* (2013.01); *G09G 2320/0233* (2013.01); *G09G 2320/045* (2013.01)

(56) References Cited

U.S. PATENT DOCUMENTS

| | | | |
|---|---|---|---|
| 2006/0011985 A1* | 1/2006 | Cai | H01L 21/823425 257/369 |
| 2006/0170634 A1* | 8/2006 | Kwak | G09G 3/3233 345/92 |
| 2007/0075378 A1* | 4/2007 | Lin | H01L 29/7848 257/383 |
| 2008/0169500 A1 | 7/2008 | Lojek | |
| 2010/0264995 A1* | 10/2010 | Braithwaite | H01L 27/0617 331/117 FE |
| 2011/0298019 A1* | 12/2011 | Fenouillet-Beranger | H01L 21/743 257/288 |
| 2015/0009105 A1* | 1/2015 | Nomura | G09G 3/006 345/76 |
| 2015/0249134 A1* | 9/2015 | Ostermaier | H01L 29/0649 257/76 |
| 2016/0035282 A1* | 2/2016 | Lu | H05B 33/0896 315/291 |
| 2016/0064411 A1 | 3/2016 | Park et al. | |
| 2016/0217746 A1* | 7/2016 | An | G09G 3/3233 |
| 2016/0247927 A1* | 8/2016 | Nomura | H01L 29/7869 |

FOREIGN PATENT DOCUMENTS

| | | |
|---|---|---|
| CN | 100433079 C | 11/2008 |
| CN | 104282261 A | 1/2015 |
| CN | 106409845 A | 2/2017 |
| KR | 100543013 B1 * | 1/2006 |

OTHER PUBLICATIONS

The CN1OA issued Mar. 24, 2020 by the CNIPA.
Wu, xin,"EMU electric power technology foundation",Aug. 30, 2013.
The CNNOA issued Nov. 18, 2020 by the CNIPA.

* cited by examiner

COMMON-GATE TRANSISTOR, PIXEL CIRCUIT, DRIVING METHOD AND DISPLAY

CROSS REFERENCE

This application is based upon and claims priority to Chinese Patent Application No. 201710369938.4, filed on May 23, 2017, the entire contents thereof are incorporated herein by reference.

TECHNICAL FIELD

The present disclosure relates to the technical field of electronic display, and in particular, to a common-gate transistor, a pixel circuit, a driving method, and a display.

BACKGROUND

In the circuit design, the common-gate transistor is a common transistor structure. For example, a common mirror transistor is a special common-gate transistor, and there are at least one group of mirror transistors in a constant current source circuit, a differential circuit, and the like. Correspondingly, in the circuit fabrication, there are two independent transistors, and the gates thereof are electrically connected to each other.

However, the common-gate transistor is one group of transistors, which occupy two transistor positions in the circuit fabrication, thereby increasing an area of the circuit on the circuit board, which is not conducive to improve the integration of the circuit board.

In summary, the existing common-gate transistor has a problem that the occupied area is too large.

SUMMARY

The present disclosure provides a common-gate transistor, a pixel circuit, a driving method, and a display to solve the problem that the existing common-gate transistor has a large occupied area.

An embodiment of the present disclosure provides a common-gate transistor including:

a first doped region, a second doped region, a third doped region, a fourth doped region and a fifth doped region;

wherein the second doped region, the third doped region, the fourth doped region and the fifth doped region are indirectly communicated through the first doped region, and the second doped region, the third doped region, the fourth doped region, the fifth doped region, and the first doped region are hetero-doped respectively.

Alternatively, the second doped region, the third doped region, the fourth doped region, and the fifth doped region combines into at least two groups of doped regions that have centrosymmetric position structures and identical electrical properties, and the doped regions having centrosymmetric position structures and identical electrical properties constitute a group of source doped regions or a group of drain doped regions of the common-gate transistor.

Alternatively, the second doped region, the third doped region, the fourth doped region, and the fifth doped region have identical electrical properties, and two groups of combined doped regions are centrosymmetrically distributed with respect to the first doped region.

Alternatively, the common-gate transistor further includes: an insulating medium, wherein the insulating medium fills an area among the second doped region, the third doped region, the fourth doped region, and the fifth doped region.

An embodiment of the present disclosure provides a pixel circuit, including the above-mentioned common-gate transistor, wherein the pixel circuit further includes: a compensation unit, a driving unit, a light emitting unit, a capacitor, and an external power supply;

the compensation unit is electrically connected to the driving unit through a first node; the external power supply, the driving unit, and the light emitting unit are connected in series in sequence; and the capacitor is located between the first node and the external power supply;

the compensation unit externally connects a data signal and a first scanning signal, and the compensation unit is configured to set a voltage of the first node to a first voltage under an effect of the first scanning signal, the first voltage being a voltage obtained by compensating a voltage of the data signal by a compensation transistor in the compensation unit;

the capacitor is configured to keep the voltage of the first node as the first voltage; and the driving unit externally connects a first control signal, and the driving unit is configured to generate a driving current to drive the light emitting unit to emit light according to the first control signal; the driving current is obtained according to the first voltage, the external power supply and a threshold voltage of a driving transistor in the driving unit; and the driving transistor and the compensation transistor are the common-gate transistor.

Alternatively, the pixel circuit further includes: an initialization unit;

wherein the initialization unit is located between the first node and the light emitting unit, and the initialization unit externally connects a second scanning signal and an initialization voltage; and the initialization unit is configured to initialize the first node and the light emitting unit using the initialization voltage under a control of the second scanning signal.

An embodiment of the present disclosure provides a method for driving a pixel circuit, applied to the above-mentioned pixel circuit, wherein the method includes:

in a data writing stage, controlling the first scanning signal to turn on the compensation unit, then the compensation unit setting the voltage of the first node to the first voltage; controlling the first control signal to turn off the driving unit to make the light emitting unit not emit light; and keeping the voltage of the first node as the first voltage by the capacitor; wherein the first voltage is a voltage obtained by compensating a voltage of the data signal through a compensation transistor in the compensation unit; and in a light emitting phase, controlling the first scanning signal to turn off the compensation unit, and controlling the first control signal to turn on the driving unit, then the driving unit generating a driving current to drive the light emitting unit to emit light; the driving current being obtained according to the first voltage, the external power supply and the threshold voltage of the driving transistor in the driving unit; and the capacitor being in a holding state.

Alternatively, before the data writing phase, the method further includes:

in an initialization phase, controlling the second scanning signal to turn on the initialization unit, then the initialization unit initializing the first node and the light emitting unit by using the initialization voltage, the capacitor keeping the initialization voltage; and controlling the first scanning signal to turn off the compensation unit and controlling the first control signal to turn off the driving unit.

Alternatively, in the data writing stage, the method further includes: controlling the second scanning signal to turn off the initialization unit; and in the light emitting stage, the method further includes: controlling the second scanning signal to turn off the initialization unit.

An embodiment of the present disclosure provides a display, including the above-mentioned common-gate transistor and pixel circuit.

In summary, the embodiments of the present disclosure provide a common-gate transistor, a pixel circuit, a driving method, and a display, the common-gate transistor includes: a first doped region, a second doped region, a third doped region, a fourth doped region, and a fifth region, a doped region; the second doped region, the third doped region, the fourth doped region, and the fifth doped region are indirectly connected through the first doped region, and the second doped region, the third doped region, and the second region The doped region, the fifth doped region and the first doped region are all hetero-doped. With the above scheme, two groups of the doped regions among the second doped region, the third doped region, the fourth doped region, and the fifth doped region constitute one group of source doped regions or one group of drains of the common-gate transistor, the first doped region in the middle serves as a gate doped region, so that two transistors in the common-gate transistor share one gate doped region, which can save one gate doped region, moreover, because the gates of the two transistors are the same gate doped region, the electrical parameters of the gate of the two transistors can be kept the same, thereby the cascode effect of the two transistors is more ideal.

BRIEF DESCRIPTION OF THE DRAWINGS

In order to more clearly illustrate the technical solutions in the embodiments of the present disclosure, the drawings used in the description of the embodiments are briefly described below. Obviously, the drawings in the following description merely illustrate some embodiments of the present disclosure. Those skilled in the art may also obtain other drawings based on these drawings without any creative labor.

DETAILED DESCRIPTION

To make the objectives, technical solutions, and advantages of the present disclosure clearer, the following will describe the present disclosure in further detail with reference to the accompanying drawings. Obviously, the described embodiments are merely some but not all of the embodiments of the present disclosure. All other embodiments obtained by a person of ordinary skill in the art based on the embodiments of the present disclosure without creative efforts shall fall within the protection scope of the present disclosure.

An embodiment of the present disclosure provides a common-gate transistor, including a first doped region, a second doped region, a third doped region, a fourth doped region and a fifth doped region; wherein the second doped region, the third doped region, the fourth doped region, and the fifth doped region are indirectly communicated through the first doped region, and the second doped region, the third doped region, the fourth doped region, the fifth doped region, and the first doped region are hetero-doped respectively. In a specific use process, the first doped region serves as a common-gate doped region of two common-gate transistors, and any two of the second doped region, the third doped region, the fourth doped region, and the fifth doped region are combined to constitute a source doped region and a drain doped region of one transistor. During usage, the second doped region, the third doped region, the fourth doped region, and the fifth doped region may be combined according to actual application requirements by using an external circuit.

Optionally, among the second doped region, the third doped region, the fourth doped region, and the fifth doped region, there are at least two groups of doped regions which are centrally symmetrical in position and structure and have completely identical electrical properties. The doped regions which are centrally symmetrical in the position and structure and have the same electrical properties constitute one group of source doped regions or one group of drain doped regions of the common-gate transistor, so that one group of mirror transistors which have a mutual mirror relationship may be obtained.

Figure 1:
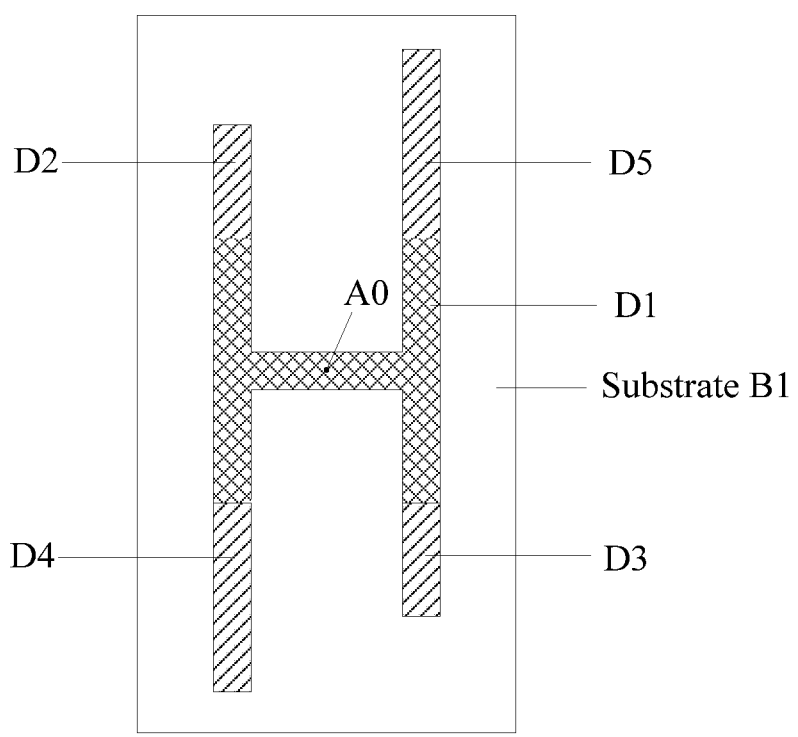
FIG. 1 is a schematic structural diagram of a common-gate transistor according to an embodiment of the present disclosure.

FIG. 1 is a schematic structural diagram of a common-gate transistor according to an embodiment of the present disclosure. As shown in FIG. 1, a first doped region D1, a second doped region D2, a third doped region D3, a fourth doped region D4, and a fifth doped region D5 are grown on a substrate B1. Assuming that the transistor shown in FIG. 1 is a Positive channel Metal Oxide Semiconductor (PMOS) transistor, the second doped region D2, the third doped region D3, the fourth doped region D4, and the fifth doped region D5 are indirectly connected through the first doped region D1, the second doped region D2, the third doped region D3, the fourth doped region D4, and the fifth doped region D5 are P-type doped, and the first doped region D1 is N-type doped. Optionally, among the second doped region D2, the third doped region D3, the fourth doped region D4 and the fifth doped region D5, the second doped region D2 and the fourth doped region D4 constitutes one group of doped regions, the third doped region D3 and the fifth doped region D5 constitutes another group of doped regions, and positions and structures of the two groups of doped regions are symmetric with respect to a center point AO. Moreover, the two groups of doped regions have the same electrical properties, including a doping concentration, a position of the doped region, a structure of the doped region, and the like. In use, the second doped region D2 and the fourth doped region D4 may serve as two source doped regions or drain doped regions of one group of mirror transistors, and the third doped region D3 and the fifth doped region D5 may serve as the doped regions for the other two electrodes. One transistor in one group of the common-gate transistors may be formed by the second doped region D2, the fifth doped region D5 and the first doped region D1, wherein the first doped region D1 is a gate of the transistor, and the second doped region D2 and the fifth doped region D5 are respectively a source and a drain of the transistor; and the other transistor in the group of the common-gate transistors may be formed by the third doped region D3, the fourth doped region D4 and the first doped region D1, wherein the first doped region D1 is the gate of the transistor, and the third doped region D3 and the fourth doped region D4 are respectively the source and the drain of the transistor.

Figure 2:
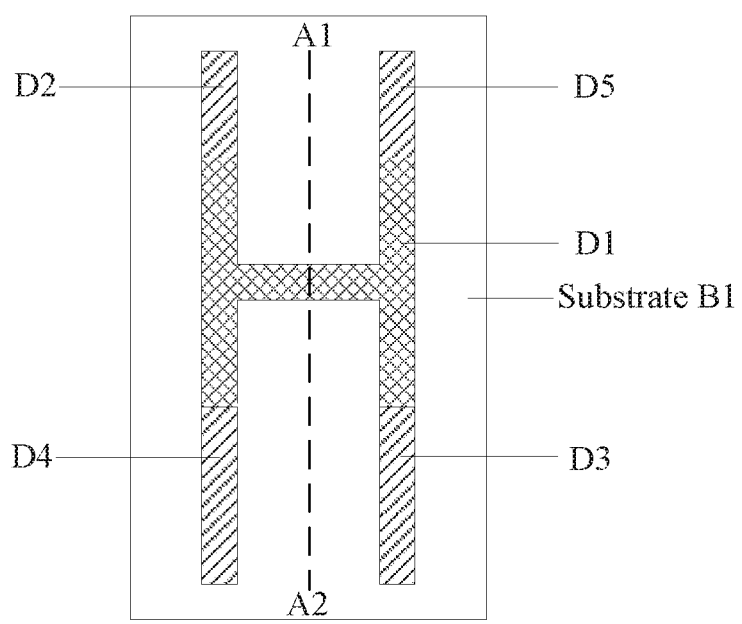
FIG. 2 is a schematic diagram of a structure which is symmetrical with respect to a central symmetrical axis according to an embodiment of the present disclosure.
Figure 3:
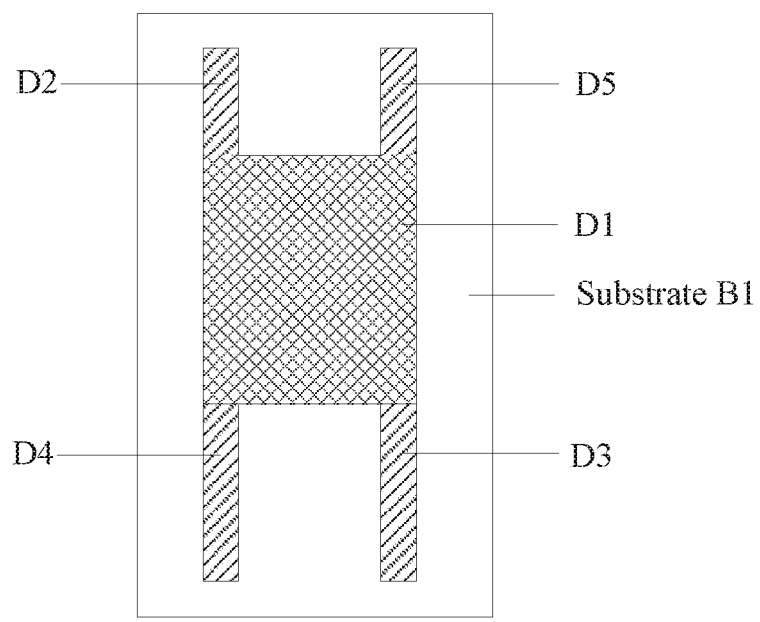
FIG. 3 is a schematic diagram of an implementation form of another first doped region according to an embodiment of the present disclosure.

It should be understood that, in the above embodiments, the center symmetry includes the structure symmetrical with respect to the center point as shown in FIG. 1, and also includes the symmetrical structure symmetrical with respect to the center symmetrical axis, as shown in FIG. 2, which shows a schematic diagram of a structure which is symmetrical with respect to the central symmetrical axis according to an embodiment of the present disclosure. As shown in FIG. 2, the second doped region D2 and the fourth doped region D4 form one group of doped regions, the third doped region D3 and the fifth doped region D5 form another group of doped regions, and the two groups of the doped regions are symmetrical about a symmetry axis A1A2. In addition, the first doped region D1 in FIGS. 1 and 2 is only a specific implementation form of the first doped region D1 provided in the embodiments of the present disclosure. In a specific implementation process, the first doped region may also be other shapes conforming to the solutions of the embodiments of the present disclosure. FIG. 3 is a schematic diagram of another implementation form of the first doped region provided by the embodiments of the present disclosure. The first doped region D1 may also be a square doped region connecting the second doped region D2, the third doped region D3, the fourth doped region D4, and the fifth doped region D5.

Figure 4:
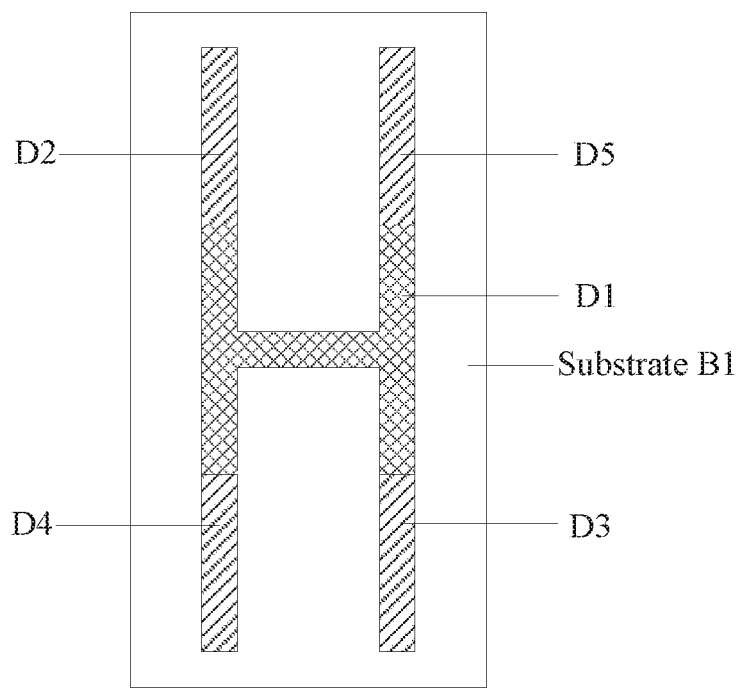
FIG. 4 is a schematic structural diagram of a fully symmetric common-gate transistor according to an embodiment of the present disclosure.

Based on the common-gate transistor shown in FIG. 1, FIG. 2, or FIG. 3, optionally, the electrical properties of the second doped region, the third doped region, the fourth doped region, and the fifth doped region are completely the same, and the combined two groups of doped regions are symmetrically distributed with respect to the first doped region. FIG. 4 is a schematic structural diagram of a fully symmetric common-gate transistor according to an embodiment of the present disclosure. As shown in FIG. 4, the second doped region D2, the third doped region D3, the fourth doped region D4 and the fifth doped region D5 have the completely same position, shape, structure, and doping concentration, and the two groups of doped regions obtained by combining any two of the four doped regions have a centrally symmetrical distribution with respect to the center of the first doped region D1. For example, as shown in FIG. 4, a combination of the second doped region D2 and the third doped region D3 and a combination of the fourth doped region D4 and the fifth doped region D5 are centrosymmetrically distributed relative to the first doped region D1, and a combination of the second doped region D2 and the fourth doped region D4 and a combination of the third doped region D3 and the fifth doped region D5 are also centrosymmetrically distributed with respect to the first doped region D1. In the specific use process, as to the division of the sources and the drains of two transistors in one group of the common-gate transistors, it is possible to connect corresponding electrodes on the five doped regions via an external circuit according to an actual circuit design, so as to functionally divide four doped regions including the combination of the second doped regions D2 and the first portion and the combination of the third doped region D3 and the fifth doped region D5. The second doped region, the third doped region, the fourth doped region, and the fifth doped region have completely the same electrical properties, and the combined two groups of the doped regions are centrosymmetrically distributed with respect to the first doped region. In this way, the electrode division forms for obtaining the mirror transistor through the common-gate transistor are more diverse, and the obtained mirror transistor can flexibly adapt to the connection requirements in the design structure of various circuits.

Figure 5:
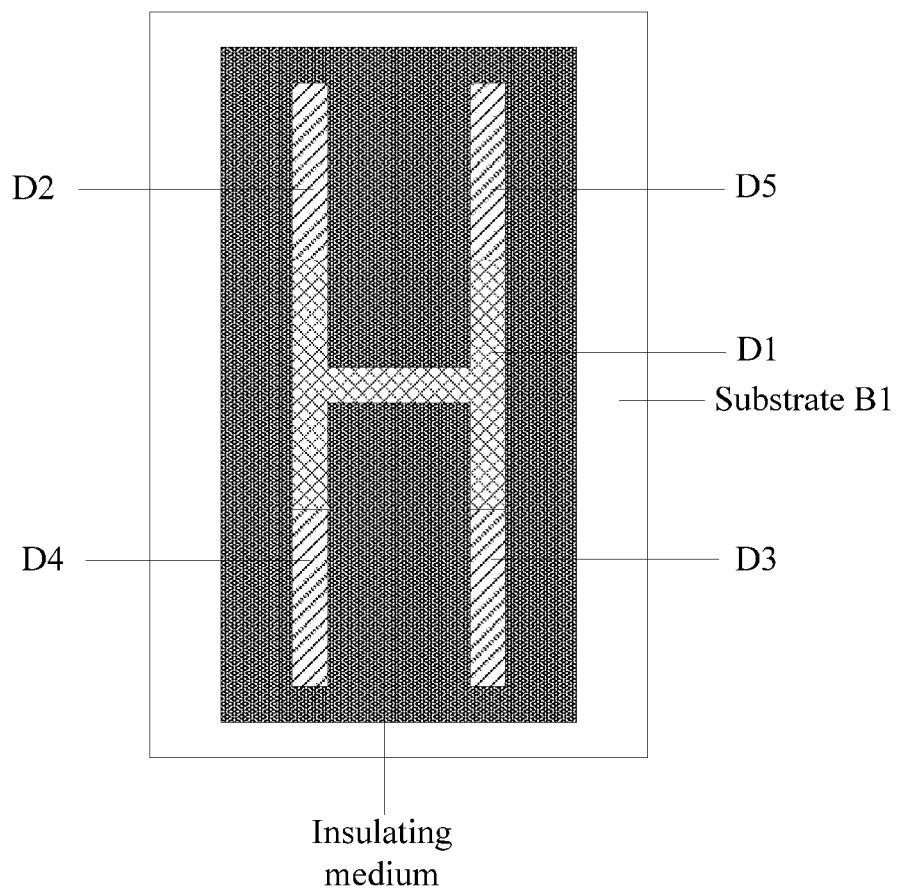
FIG. 5 is a schematic diagram of a distribution of an insulation medium according to an embodiment of the present disclosure.

Optionally, the common-gate transistor further includes: an insulating medium, and the insulating medium fills a region between the second doped region, the third doped region, the fourth doped region and the fifth doped region. FIG. 5 is a schematic diagram of a distribution of an insulation medium provided by an embodiment of the present disclosure. As shown in FIG. 5, the insulation medium fills the region between the second doped region D2, the third doped region D3, the fourth doped region D4, and the fifth doped region D5. The insulating medium can not only limit carriers in the second doped region D2, the third doped region D3, the fourth doped region D4 and the fifth doped region D5 to flow in a channel formed by the first doped region D1, but also serve to protect and support the five doped regions.

It should be noted that the embodiments of the present disclosure introduce the structure of the common-gate transistor provided by the embodiments of the present disclosure only from the perspective of the doped region in the common-gate transistor. In practical use, the common-gate transistor may also include other additional structures, such as a metal electrode layer on each doped region, so as to enable an electrical connection between the common-gate transistor and the external circuit.

To sum up, the embodiments of the present disclosure provide a common-gate transistor including a first doped region, a second doped region, a third doped region, a fourth doped region and a fifth doped region; the second doped region, the third doped region, the fourth doped region, and the fifth doped region are indirectly connected through the first doped region, and the second doped region, the third doped region, the fourth doped region, the fifth doped region, and the first doped region are hetero-doped respectively. According to the above scheme, two groups of doped regions among the second doped region, the third doped region, the fourth doped region, and the fifth doped region constitute one group of source doped regions or one group of drain doped regions, and the first doped region in the middle serves as a gate doped region, so that two transistors in the common-gate transistor share one gate doped region, which can save one gate doped region; moreover, since the gates of the two transistors are the same gate doped region, the electrical parameters of the gates of the two transistors can be made closer to each other, and the common-gate effect of the two transistors is more ideal.

Based on the same technical idea, an embodiment of the present disclosure provides a pixel circuit, including the common-gate transistor disclosed in any one of the above embodiments. The pixel circuit includes: a compensation unit, a driving unit, a light emitting unit, a capacitor, and an external power supply. The compensation unit is electrically connected to the driving unit through a first node. The external power source, the driving unit and the light emitting unit are connected in series in sequence. The capacitor is located between the first node and the external power source. The compensation unit externally connects to a data signal and a first scanning signal, and the compensation unit is used to set a voltage of the first node to a first voltage under the first scanning signal, the first voltage being a voltage obtained by compensating a voltage of the data signal by a compensation transistor in the compensation unit. The capacitor is used to maintain the voltage of the first node as the first voltage. The driving unit externally connects to a first control signal, and the driving unit is configured to generate a driving current to drive the light emitting unit to emit light according to the first control signal. The driving current is obtained according to the first voltage, the external power supply and a threshold voltage of a driving transistor in the driving unit. The driving transistor and the compensation transistor are the common-gate transistor.

Figure 6:
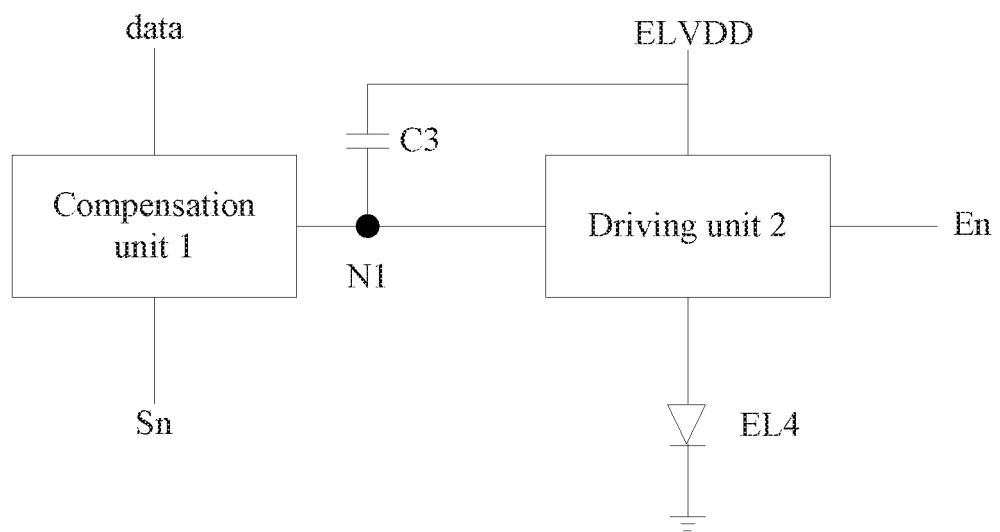
FIG. 6 is a schematic diagram of an architecture of a pixel circuit according to an embodiment of the present disclosure.

FIG. 6 is a schematic diagram of an architecture of a pixel circuit according to an embodiment of the present disclosure. As shown in FIG. 6, the pixel circuit includes a compensation unit 1, a driving unit 2, a capacitor C3, a light emitting unit EL4, and an external power supply ELVDD. The compensation unit 1 is electrically connected to the driving unit 2 through a first node N1. The external power source ELVDD, the driving unit 2, and the light emitting unit EL4 are connected in series in turn. The capacitor C3 is located between the first node N1 and the external power source ELVDD. The compensation unit 1 externally connects a data signal data and a first scanning signal Sn, and the compensation unit 1 is used to set a voltage of the first node N1 to a first voltage under an effect of the first scanning signal Sn, i.e., ($V_{data}+V_{thT1}$), wherein $V_{thT1}$ is a threshold voltage of a compensation transistor in the compensation unit 1. The capacitor C3 is used for keeping the voltage of the first node N1 as the first voltage ($V_{data}+V_{thT1}$). The driving unit 2 externally connects a first control signal En, and when the first control signal En controls the driving unit 2 to be turned on, the driving unit 2 generates a driving current to drive the light emitting unit EL4 to emit light. The driving current is obtained according to the first voltage, the external power source ELVDD, and the threshold voltage of the driving transistor in the driving unit 2. At this time, a magnitude of the driving current $I_{EL4}$ flowing through the light emitting unit EL4 is as shown in Formula 3.

$$I_{EL4} = \frac{1}{2}\mu C_{OX}\frac{W}{L}(V_{ELVDD} - V_{N1} + V_{thT2})^2 \qquad \text{(Formula 3)}$$

wherein, $V_{ELVDD}$ is the voltage of the external power source ELVDD, $V_{N1}$ is the first voltage, $V_{thT2}$ is the threshold voltage of the driving transistor. Since the driving transistor and the compensation transistor are the common-gate transistor, the threshold voltage of the driving transistor and the threshold voltage of the compensation transistor T1 have the same change tendency, i.e., $V_{thT1}-V_{thT2}=A$, wherein A is a constant. Thus, Formula 3 may be further transformed into:

$$I_{EL} = \frac{1}{2}\mu C_{OX}\frac{W}{L}(V_{ELVDD} - V_{data} - A)^2. \qquad \text{(Formula 4)}$$

Thus, an influence of the threshold current of the driving transistor on the light emitting diode is eliminated. In addition, in the pixel circuit shown in FIG. 3, the data signal data is connected to the compensation unit 1, and the ELVDD is connected to the driving unit 2, so that in a data writing stage, the data signal data is written into the first node N1 by the compensation unit 1. In a light emitting stage, the ELVDD is connected to the driving unit 2, and the data signal data and the external power source ELVDD are isolated from each other, thereby avoiding the influence of the external power source ELVDD on the data signal data and improving the light emitting stability of the light emitting transistor. In the specific implementation process, the internal structures of the compensation unit 1 and the driving unit 2 are not specifically limited in the embodiments of the present disclosure, and all the pixel circuits satisfying the functions and interaction relationships of the compensation unit 1 and the driving unit 2 in the above embodiments are included in the embodiments of the present disclosure.

Optionally, the driving transistor and the compensation transistor are the mirror transistor, and both have the same threshold voltage, i.e., $V_{thT1}=V_{thT2}$, then the Formula 4 may be further simplified to a relationship shown in Formula 2:

$$I_{EL} = \frac{1}{2}\mu C_{OX}\frac{W}{L}(V_{ELVDD} - V_{data})^2. \qquad \text{(Formula 2)}$$

In the above pixel circuit, the compensation unit externally connects the data signal, and the driving unit externally connects an external power source, so that in the data writing stage, the data signal is compensated by the compensation transistor in the compensation unit, and the threshold voltage of the compensation transistor is compensated to the voltage of the data signal so as to obtain the first voltage. Since the compensation unit does not connect an external power supply, the influence of the external power supply on the data signal is avoided. Moreover, the driving transistor and the compensation transistor are the common-gate transistor, both having the same change trend of threshold voltage, so compensating the threshold voltage of the compensation transistor to the voltage of the data signal corresponds to compensating the threshold voltage of the driving transistor to the voltage of the data signal. This ensures the threshold compensation function of the pixel circuit. Therefore, the embodiments of the present disclosure can achieve the threshold compensation function of the pixel circuit while avoiding the influence of the external power supply on the data signal and improving the light-emitting stability of the light-emitting diode.

Figure 7:
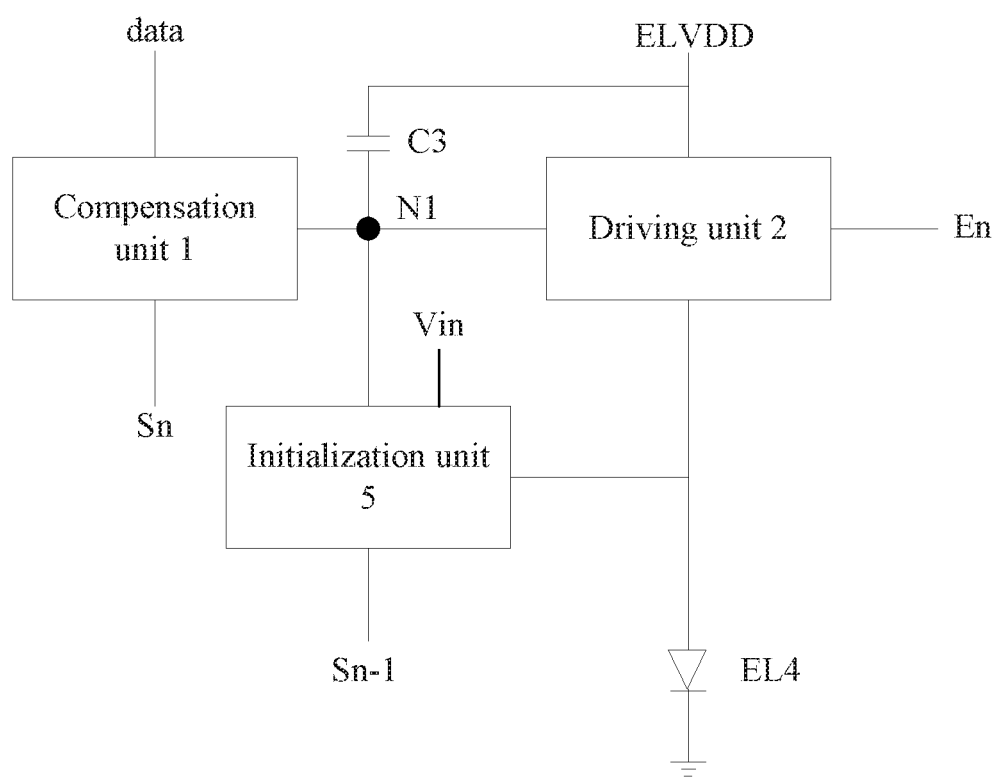
FIG. 7 is a schematic diagram of an architecture of a pixel circuit with an initialization function according to an embodiment of the present disclosure.

Optionally, the pixel circuit provided by the embodiments of the present disclosure further includes an initialization unit. FIG. 7 is a schematic diagram of a structure of a pixel circuit with an initialization function according to an embodiment of the present disclosure. In FIG. 7, an initialization unit 5 is located between a first node N1 and a light emitting unit EL4, and is externally connected to a second scanning signal Sn−1 and an initialization voltage Vin. When the second scanning signal Sn−1 turns on the initialization unit, the initialization unit outputs the initialization voltage to the first node N1 and the light emitting unit EL4, and the capacitor C3 is discharged until the voltage drops to Vin, thereby implementing the initialization of the first node N1 and the light emitting unit EL4. The initialization may release the voltage at the first node N1 to ensure that in the next data writing phase, the data signal may be written to the N1 node. In the embodiments of the present disclosure, the internal structure of the initialization unit 5 is not specifically limited, and all the pixel circuits satisfying the function of the initialization unit 5 and the interaction relationships between the initialization unit 5 and the compensation unit 1, the driving unit 2 in the above embodiments are included in the embodiments of the present disclosure. In the specific implementation process, Vin may be an independent initialization signal, or it may be a second scanning signal Sn−1. At this time, when the second scanning signal Sn−1 turns on a first initialization transistor T6 and a second initialization transistor T7, the first initialization transistor T6 and the second initialization transistor T7 are in a saturated state, and the second scanning signal is input to the first node N1 and an anode of the light emitting unit EL4 through the first initialization transistor T6 and the second initialization transistor T7, respectively, until the first initialization transistor T6 and the second initialization transistor T7 are cut off, thereby completing the initialization of the first node N1 and the light emitting unit EL4.

Figure 8:
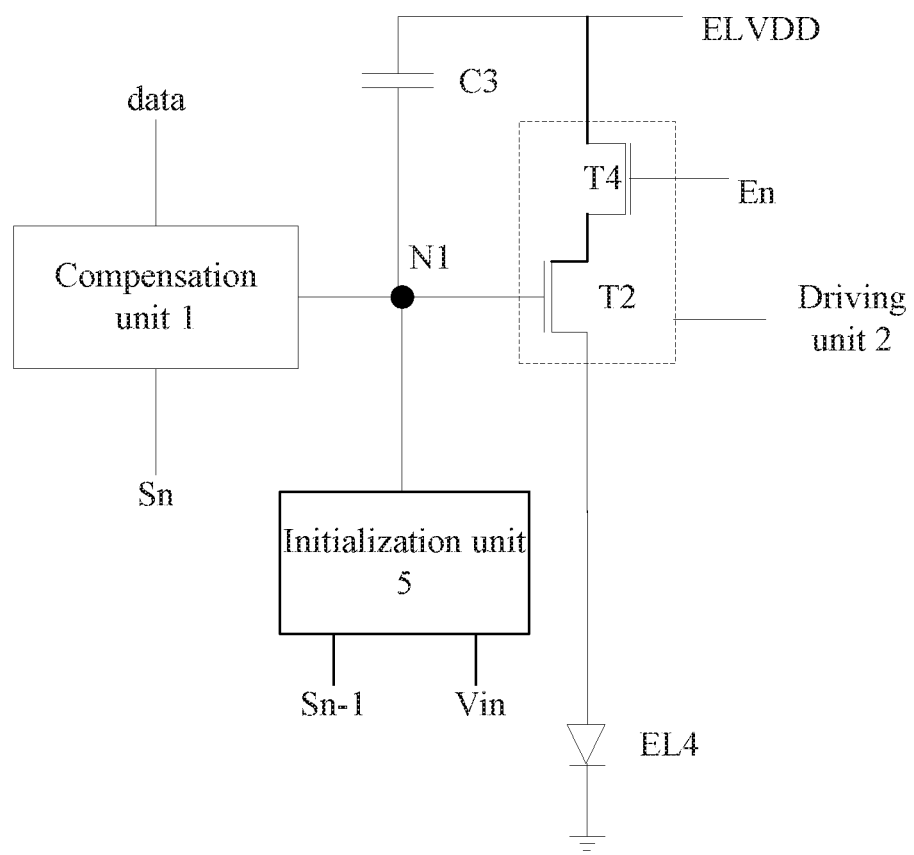
FIG. 8 is a schematic structural diagram of a driving unit according to an embodiment of the present disclosure.

Optionally, an embodiment of the present disclosure further provides a feasible implementation manner of a driving unit. FIG. 8 is a schematic structural diagram of a driving unit according to an embodiment of the present disclosure. In the pixel circuit shown in FIG. 8, a driving unit 2 includes a driving transistor T2 and a light emitting control transistor T4; a first electrode of the light emitting control transistor T4 is externally connected to the external power supply ELVDD; a second electrode of the light emitting control transistor T4 is electrically connected to a first electrode of the driving transistor T2; and a gate of the light emitting control transistor T4 is externally connected to a first control signal En; a gate of the driving transistor T2 is electrically connected to the compensation unit 1; and a second electrode of the driving transistor T2 is electrically connected to the light emitting unit EL4. When En turns on the light emitting control transistor T4, the external power source ELVDD is connected with the first electrode of the driving transistor T2 via the light emitting control transistor T4. The driving transistor T2 generates a driving current according to the gate voltage and the external power source ELVDD, and the driving current is inputted through the light emitting control transistor to the light emitting unit EL4 and drives the EL4 to emit light.

Figure 9:
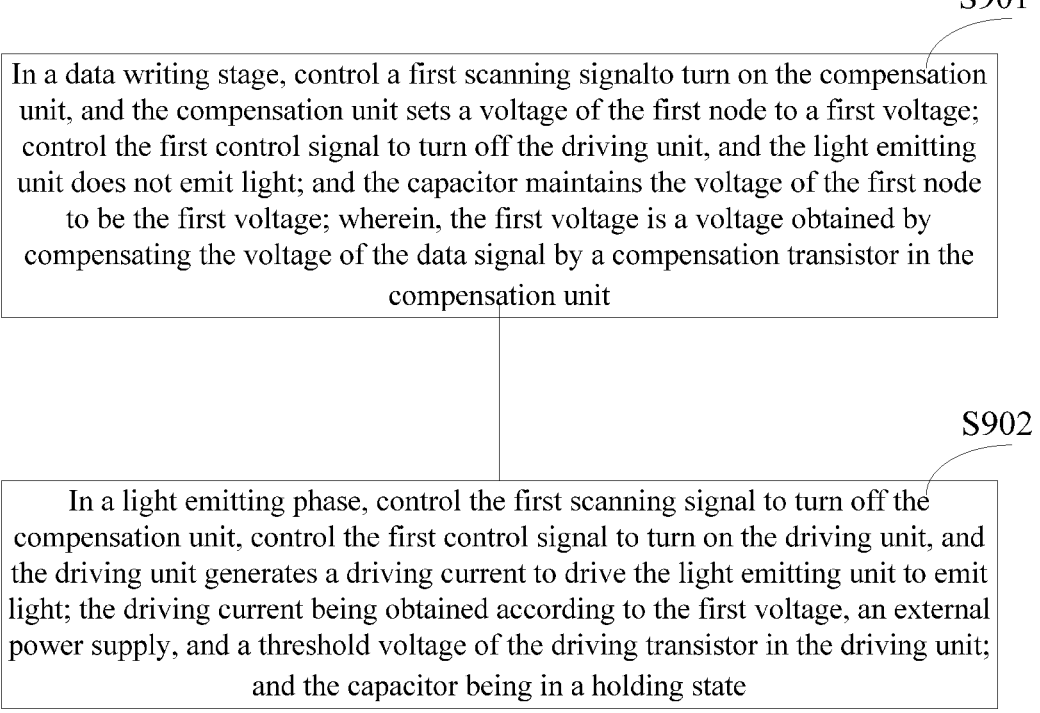
FIG. 9 is a flowchart of a method for driving a pixel circuit according to an embodiment of the present disclosure.

Based on the same technical idea, an embodiment of the present disclosure further provides a method for driving a pixel circuit, which is capable of driving the pixel circuit disclosed in any one of the above embodiments. FIG. 9 is a flowchart of a method for driving a pixel circuit according to an embodiment of the present disclosure. As shown in FIG. 9, the method includes the following steps.

In S901, in a data writing stage, a first scanning signal is controlled to turn on the compensation unit, and the compensation unit sets a voltage of the first node to a first voltage; the first control signal is controlled to turn off the driving unit, and the light emitting unit does not emit light; and the capacitor maintains the voltage of the first node to be the first voltage; wherein, the first voltage is a voltage obtained by compensating the voltage of the data signal by a compensation transistor in the compensation unit.

In S902, in a light emitting phase, the first scanning signal is controlled to turn off the compensation unit, and the first control signal is controlled to turn on the driving unit, then the driving unit generates a driving current to drive the light emitting unit to emit light; the driving current is obtained according to the first voltage, an external power supply, and a threshold voltage of the driving transistor in the driving unit; and the capacitor is in a holding state.

Figure 10:
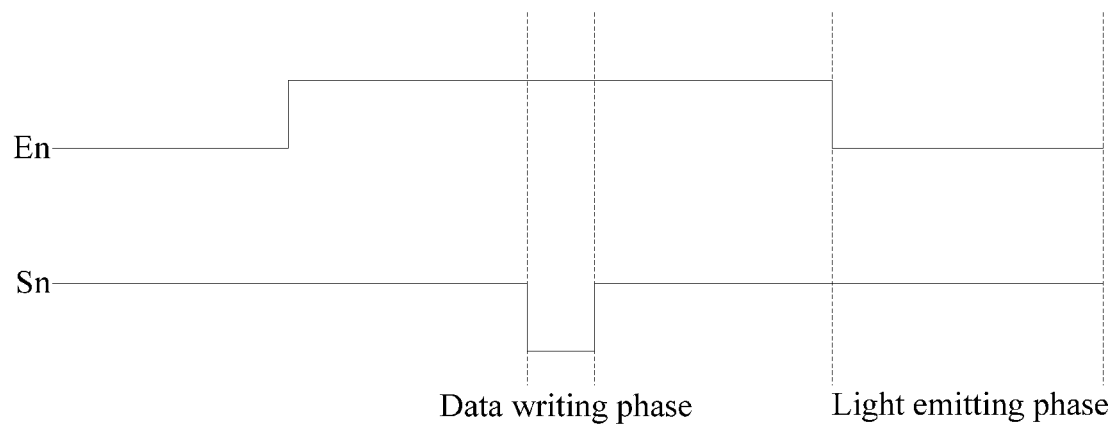
FIG. 10 is a schematic diagram of a driving signal according to an embodiment of the present disclosure.

During a specific implementation, the above embodiment may drive the pixel circuit as shown in FIG. 6. Optionally, the compensation unit 1 and the driving unit 2 are turned on or off by controlling the conduction (turning-on) of the transistors in the compensation unit 1 and the driving unit 2. At this time, a driving signal corresponding to the pixel circuit shown in FIG. 6 is as shown in FIG. 10. FIG. 10 is a schematic diagram of a driving signal provided by an embodiment of the present disclosure. The driving signal in FIG. 10 includes two kinds of signals, i.e., a first scanning signal Sn and a first control signal En, and discloses time sequences of the first scanning signal Sn and the first control signal En when the transistors of the compensation unit 1 and the driving unit 2 in the circuit shown in FIG. 6 are Positive channel Metal Oxide Semiconductor (PMOS) transistors.

In the data writing stage, as shown in FIG. 10, the first scanning signal Sn is at a low level, the compensation unit 1 is turned on, the first control signal En is at a high level, and the driving unit 2 is turned off. The compensation unit 1 writes the data signal data to the first node N1, and the capacitor C3 starts charging until the voltage of the first node N1 is set to the first voltage ($V_{data}+V_{thT1}$). After that, the compensation transistor in the compensation unit 1 is turned off, and the capacitor C3 maintains the voltage of the first node N1 as the first voltage ($V_{data}+V_{thT1}$).

In the light emitting stage, as shown in FIG. 10, the first scanning signal Sn is at a high level, the compensation unit 1 is turned off, the first control signal En is at a low level, and the driving unit 2 is turned on. The driving unit 2 generates a driving current to drive the light emitting unit EL4 to emit light. Since the voltage of the first node is the first voltage ($V_{data}+V_{thT1}$), a gate voltage of the driving transistor in the driving unit 2 may be threshold-compensated so that the driving current is no longer affected by a threshold drift of the driving transistor.

Figure 11:
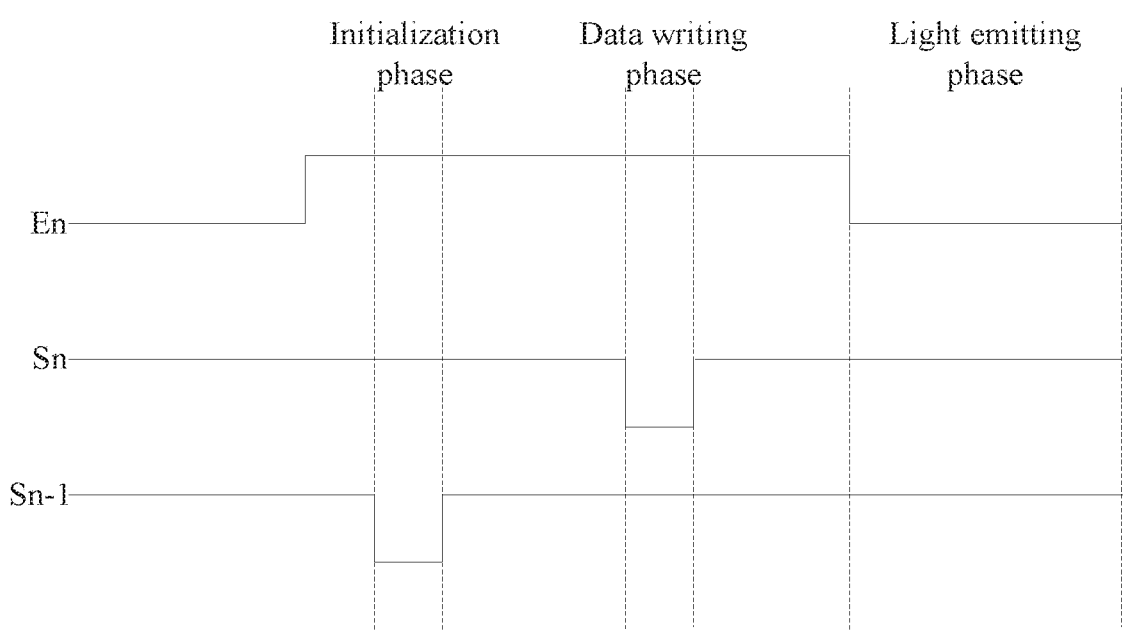
FIG. 11 is a schematic diagram of a driving signal according to an embodiment of the present disclosure.

Corresponding to the pixel circuit shown in FIG. 7, an embodiment of the present disclosure further provides another method for driving a pixel circuit. FIG. 11 is a schematic diagram of a driving signal according to an embodiment of the present disclosure. As shown in FIG. 11, the driving signal includes a first scanning signal Sn, a second scanning signal Sn−1, and a first control signal En. In addition, it is also disclosed the time sequences of the first scanning signal Sn, the second scanning signal Sn−1, and the first control signal En when the transistors of the compensation unit 1, the driving unit 2, and the initialization unit 5 in the circuit shown in FIG. 7 are PMOS transistors. Before the data writing phase, an initialization phase is also included, which is specifically described as follows.

In the initialization phase, the second scanning signal Sn−1 is controlled to turn on the initialization unit 5, the initialization unit 5 initializes the first node N1 and the light emitting unit EL4 with an initialization voltage Vin, the capacitor C3 maintains the initialization voltage Vin, and the first scanning signal Sn is controlled to turn off the compensation unit 1 and the first control signal En is controlled to turn off the driving unit 2.

In the data writing phase, as shown in FIG. 11, the first scanning signal Sn is at a low level, the compensation unit 1 is turned on, the first control signal En is at a high level, the driving unit 2 is turned off, the second scanning signal Sn−1 is at a high level, and the initialization unit is turned off. The compensation unit 1 writes the data signal data to the first node N1, and the capacitor C3 starts charging until the voltage of the first node N1 is set to the first voltage ($V_{data}+V_{thT1}$). After that, the compensation transistor in the compensation unit 1 is cut off, and the capacitor C3 maintains the voltage of the first node N1 as the first voltage ($V_{data}+V_{thT1}$).

In the light emitting stage, as shown in FIG. 11, the first scanning signal Sn is at a high level, the compensation unit 1 is turned off, the second scanning signal Sn−1 is at a high level, the initialization unit is turned off, the first control signal En is at a low level, and the driving unit 2 is turned on. The driving unit 2 generates a driving current to drive the light emitting unit EL4 to emit light. Since the voltage of the first node is the first voltage ($V_{data}+V_{thT1}$), a gate voltage of the driving transistor in the driving unit 2 may be threshold-compensated so that the driving current is no longer affected by the threshold drift of the driving transistor.

The embodiment of the present disclosure provides a common-gate transistor, and further optimizes the common-gate transistor on the basis of the existing threshold compensation circuit, thereby avoiding the influence of the external power supply on the data signal and making the light emission of the light-emitting diode more stable. The following uses PMOS as an example to introduce several specific implementation methods. It should be pointed out that the following variations of specific implementations, such as NMOS or COMS circuits obtained after the variation, should also fall within the protection scope of the embodiments of the present disclosure. The present application does not enumerate all the deformed pixel circuits one by one, and only some of the pixel circuits are introduced to explain the technical solutions disclosed in the embodiments of the present disclosure.

First Embodiment

Figure 12:
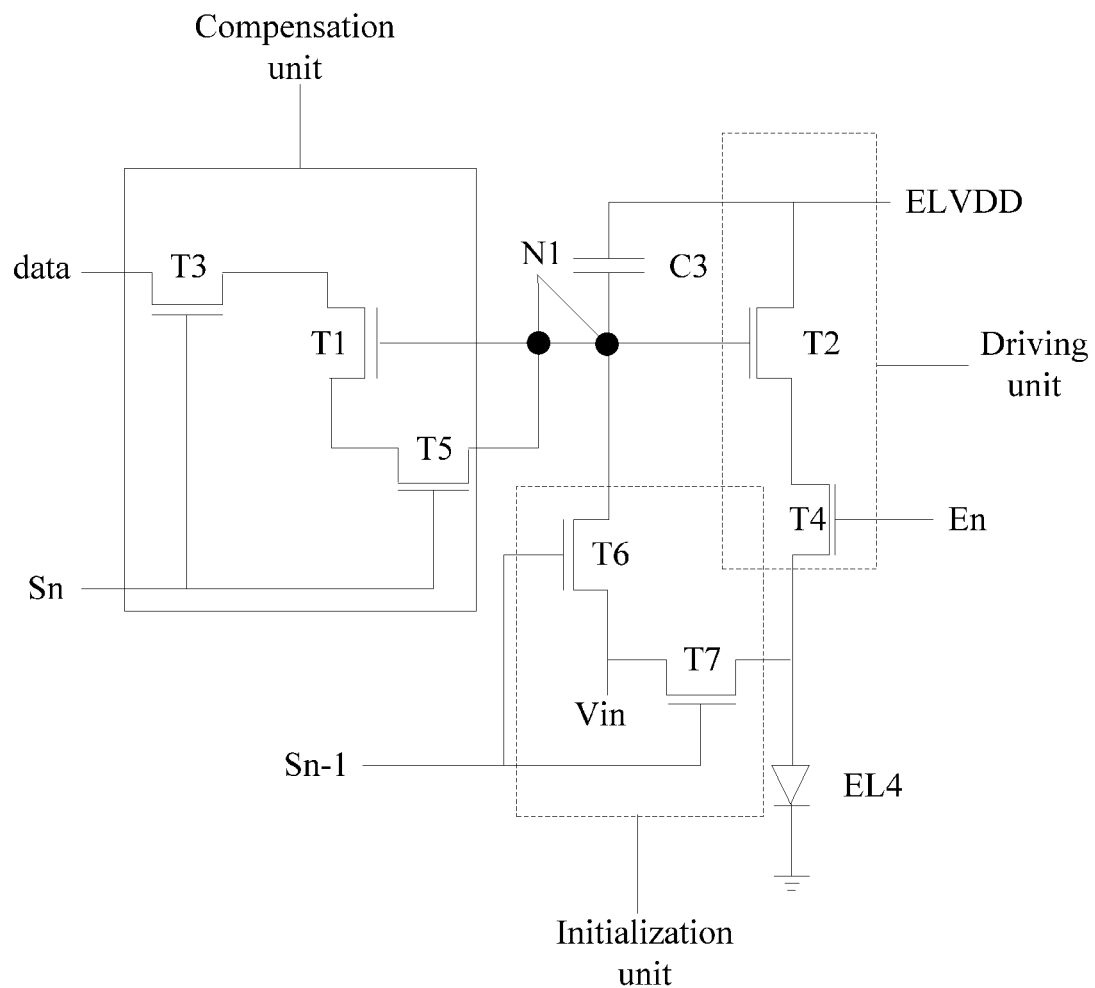
FIG. 12 is one of feasible implementation manners of a pixel circuit according to an embodiment of the present disclosure.

FIG. 12 shows one possible implementation of a pixel circuit according to an embodiment of the present disclosure. As shown in FIG. 12, the compensation unit includes a data gated transistor T3, a compensation transistor T1, and a switching transistor T5. The driving unit includes a driving transistor T2, and a light emitting control transistor T4. The initialization unit includes a first initialization transistor T6 and a second initialization transistor T7.

In the compensation unit, a drain of the data gated transistor T3 is electrically connected to a source of the compensation transistor T1, and a source of the data gated transistor T3 is electrically connected to the data signal data; a gate of the data gated transistor T3 and the first scanning signal Sn are electrically connected; a gate of the compensation transistor T1 is electrically connected to a gate of the driving transistor T2 through the first node N1, and a drain of the compensation transistor T1 is electrically connected to a source of the switching transistor T5. A drain of the switching transistor T5 is electrically connected to the gate of the compensation transistor T1, and a gate of the switching transistor T5 is electrically connected to the first scanning signal Sn.

In the driving unit, an external power supply ELVDD is externally connected to a source of the driving transistor T2; a drain of the driving transistor T2 is electrically connected to a source of the light emitting control transistor T4; a drain of the light emitting control transistor T4 is electrically connected to the light emitting unit EL4, and a gate of the light emitting control transistor T4 is externally connects to the first control signal En.

In the initialization unit, a source of the first initialization transistor T6 is externally connected to the initialization voltage Vin; a drain of the first initialization transistor T6 is electrically connected to the first node N1; and a gate of the first initialization transistor T6 is electrically connected to the second scanning signal Sn−1. A source of the second initialization transistor T7 is externally connected to the initialization voltage Vin; a drain of the second initialization transistor T7 is electrically connected to the light emitting unit EL4; and a gate of the second initialization transistor T7 is electrically connected to the second scanning signal Sn−1.

The capacitor C3 is located between the first node N1 and the external power supply ELVDD.

According to the driving signal shown in FIG. 11, the method for driving the pixel circuit shown in FIG. 12 is as follows.

During the initialization phase, the first scanning signal Sn is at a high level, so that the data gated transistor T3 and the switching transistor T5 are cut off and the compensation unit is turned off. The first control signal En is at a high level, so that the light emitting control transistor T4 is cut off and the driving unit is turned off. The second control signal Sn−1 is at a low level, so that the first initialization transistor T6 and the second initialization transistor T7 are turned on, and the first initialization transistor T6 transfers the initialization voltage to the first node N1 so as to initialize the first node N1, and the second initialization transistor T7 transmits the initialization voltage Vin to the light emitting unit EL4, thereby initializing the light emitting unit EL4.

In the data writing phase, the first scanning signal Sn is at a low level, so that the data gated transistor T3 and the switching transistor T5 are turned on and the compensation unit is turned on. The first control signal En is at a high level, so that the light emitting control transistor T4 is cut off and the driving unit is turned off. The second scanning signal Sn−1 is at a high level, so that the first initialization transistor T6 and the second initialization transistor T7 are cut off, and the initialization unit is turned off. The data signal data reaches the source of the compensation transistor T1 via the data gated transistor T3. Since the switching transistor T5 is turned on, the compensation transistor T1 operates in a saturation region, and the data signal data is written into the first node N1 until the voltage of the first node N1 arrives ($V_{data}+V_{thT1}$), then the compensation transistor T1 is cut off.

In the light emitting phase, the first scanning signal Sn is at a high level, so that the data gated transistor T3 and the switching transistor T5 are cut off and the compensation unit is turned off. The first control signal En is at a low level, so that the light emitting control transistor T4 is turned on and the driving unit is turned on. The second scanning signal Sn−1 is at a high level, so that the first initialization transistor T6 and the second initialization transistor T7 are cut off, and the initialization unit is turned off. The driving transistor T2 generates a driving current to drive the light emitting unit EL4 to emit light. Since the voltage of the first node is the first voltage ($V_{data}+V_{thT1}$), a threshold compensation may be performed on the gate voltage of the driving transistor so that the driving current is no longer affected by the threshold drift of the driving transistor T2.

Second Embodiment

Figure 13:
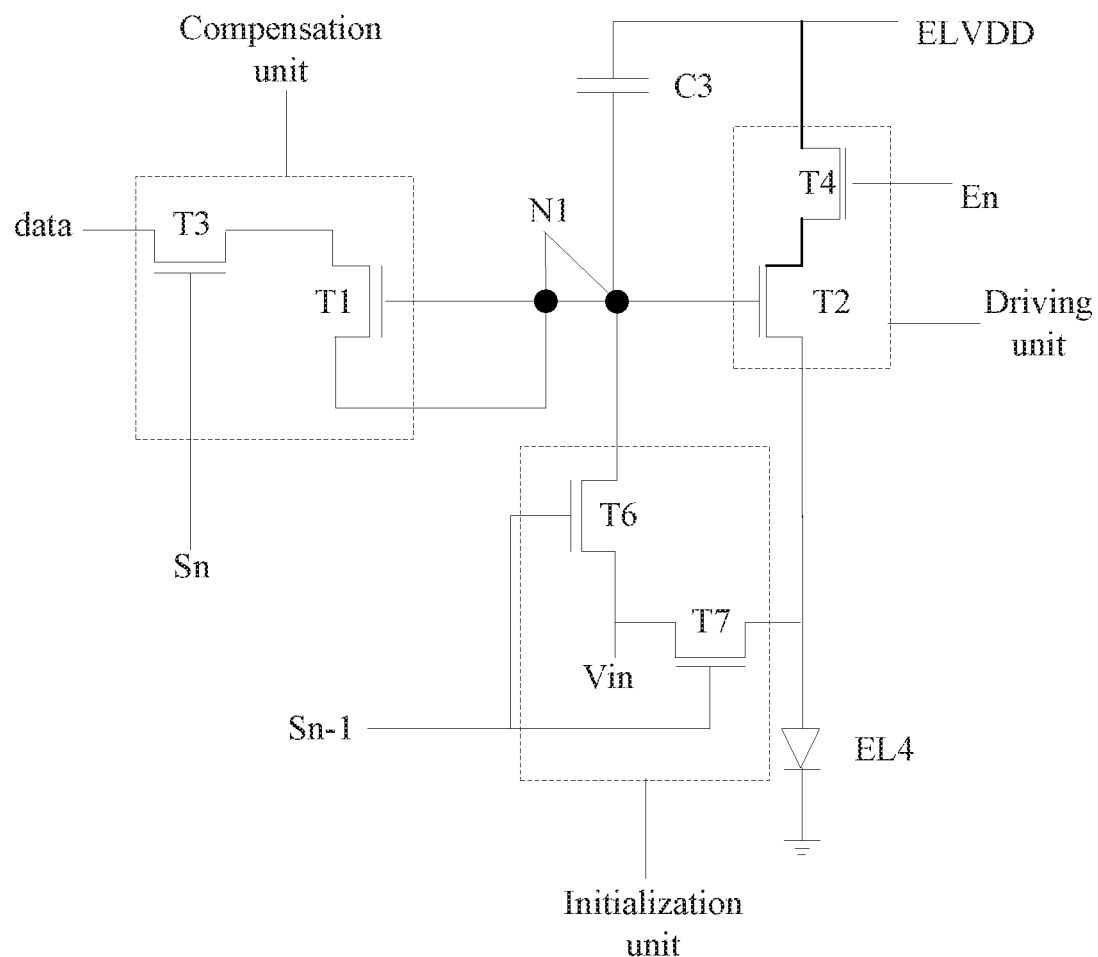
FIG. 13 is one of feasible implementation manners of a pixel circuit according to an embodiment of the present disclosure.

FIG. 13 shows one possible implementation of a pixel circuit according to an embodiment of the present disclosure. As shown in FIG. 13, the compensation unit includes a data gated transistor T3 and a compensation transistor T1. The driving unit includes a driving transistor T2 and a light emitting control transistor T4. The initialization unit includes a first initialization transistor T6 and a second initialization transistor T7.

In the compensation unit, the drain of the data gated transistor T3 is electrically connected to the source of the compensation transistor T1, the source of the data gated transistor T3 is electrically connected to the data signal data; the gate of the data gated transistor T3 and the first scanning signal Sn are electrically connected; the gate of the compensation transistor T1 is electrically connected to the gate of the driving transistor T2 through the first node N1, and the drain of the compensation transistor T1 is electrically connected to the gate of the compensation transistor T1.

In the driving unit, an external power supply ELVDD is externally connected to the source of the driving transistor T2; a drain of the driving transistor T2 is electrically connected to the source of the light emitting control transistor T4; a drain of the light emitting control transistor T4 is electrically connected to the light emitting unit EL4, and a gate of the light emitting control transistor T4 is externally connected to the first control signal En.

In the initialization unit, the source of the first initialization transistor T6 is externally connected to the initialization voltage Vin; the drain of the first initialization transistor T6 is electrically connected to the first node N1; the gate of the first initialization transistor T6 is electrically connected to the second scanning signal Sn−1; the source of the second initialization transistor T7 is externally connected to the initialization voltage Vin; the drain of the second initialization transistor T7 is electrically connected to the light emitting unit EL4; and the gate of the second initialization transistor T7 is electrically connected to the second scanning signal Sn−1.

The capacitor C3 is located between the first node N1 and the external power supply ELVDD.

According to the driving signal shown in FIG. 11, the driving method of the pixel circuit shown in FIG. 13 is as follows.

During the initialization phase, the first scanning signal Sn is at a high level, so that the data gated transistor T3 is cut off and the compensation unit is turned off. The first control signal En is at a high level, so that the light emitting control transistor T4 is cut off and the driving unit is turned off. The second control signal Sn−1 is at a low level, so that the first initialization transistor T6 and the second initialization transistor T7 are turned on, and the first initialization transistor T6 transfers the initialization voltage to the first node N so as to initialize the first node N1, and the second initialization transistor T7 transmits the initialization voltage Vin to the light emitting unit EL4, thereby initializing the light emitting unit EL4.

In the data writing phase, the first scanning signal Sn is at a low level, causing the data gated transistor T3 to be turned on and the compensation unit to be turned on. The first control signal En is at a high level, so that the light emitting control transistor T4 is cut off and the driving unit is turned off. The second scanning signal Sn−1 is at a high level, so that the first initialization transistor T6 and the second initialization transistor T7 are cut off, and the initialization unit is turned off. The data signal data reaches the source of the compensation transistor T1 through the data gated transistor T3. Since the drain and the gate of the compensation transistor T1 are short-circuited, the compensation transistor T1 operates in the saturation region, and the data signal data is written into the first node N1 until the voltage of the first node N1 reaches the first voltage ($V_{data}+V_{thT1}$), and then the compensation transistor T1 is cut off.

In the light emitting phase, the first scanning signal Sn is at a high level, so that the data gated transistor T3 is cut off and the compensation unit is turned off. The first control signal En is at a low level, so that the light emitting control transistor T4 is turned on and the driving unit is turned on. The second scanning signal Sn−1 is at a high level, so that the first initialization transistor T6 and the second initialization transistor T7 are cut off, and the initialization unit is turned off. The driving transistor T2 generates a driving current to drive the light emitting unit EL4 to emit light. Since the voltage of the first node is the first voltage ($V_{data}+V_{thT1}$), the gate voltage of the driving transistor may be threshold-compensated so that the driving current is no longer affected by the threshold drift of the driving transistor T2.

In the above first embodiment and second embodiment, the following points need to be specifically pointed out.

(1) The second initialization transistor T7 may also externally connect to the first scanning signal or a third scanning signal so that the initialization of the first node N1 and the initialization of the light-emission unit EL4 may not be performed at the same time, thereby preventing the pixel circuit or a power supply circuit supplying power to the pixel circuit from being burned due to a large instantaneous current caused by the initialization voltage Vin when the first node N1 and the light-emitting unit are simultaneously initialized.

(2) The compensation unit in FIG. 12 may also leave only the compensation transistor T1 and the switching transistor T5 and omit the data gated transistor T3, the purpose thereof is that the compensation unit includes at least one of the switching transistor T5 and the data gated transistor T3.

(3) The first initialization transistor T6 and the second initialization transistor T7 in the initialization unit may also adopt the following connection mode: a first electrode of the first initialization transistor T6 is electrically connected to the first node N1, and the gate of the first initialization transistor T6 is externally connected to the second scanning signal Sn−1, a second electrode of the first initialization transistor T6 is electrically connected to the light emitting unit EL4, the first electrode of the second initialization transistor T7 is electrically connected to the light emitting unit EL4, the second electrode of the second initialization transistor T7 is externally connected to an initialization voltage Vin, and the gate of the second initialization transistor T7 externally connects to the second scanning signal Sn−1; the first initialization transistor T6 and the second initialization transistor T7 are a double-gate transistor, and one double-gate transistor is used instead of the original T6 and T7, so that the number of the transistors in the pixel circuit is reduced, thereby simplifying the circuit.

Figure 14:
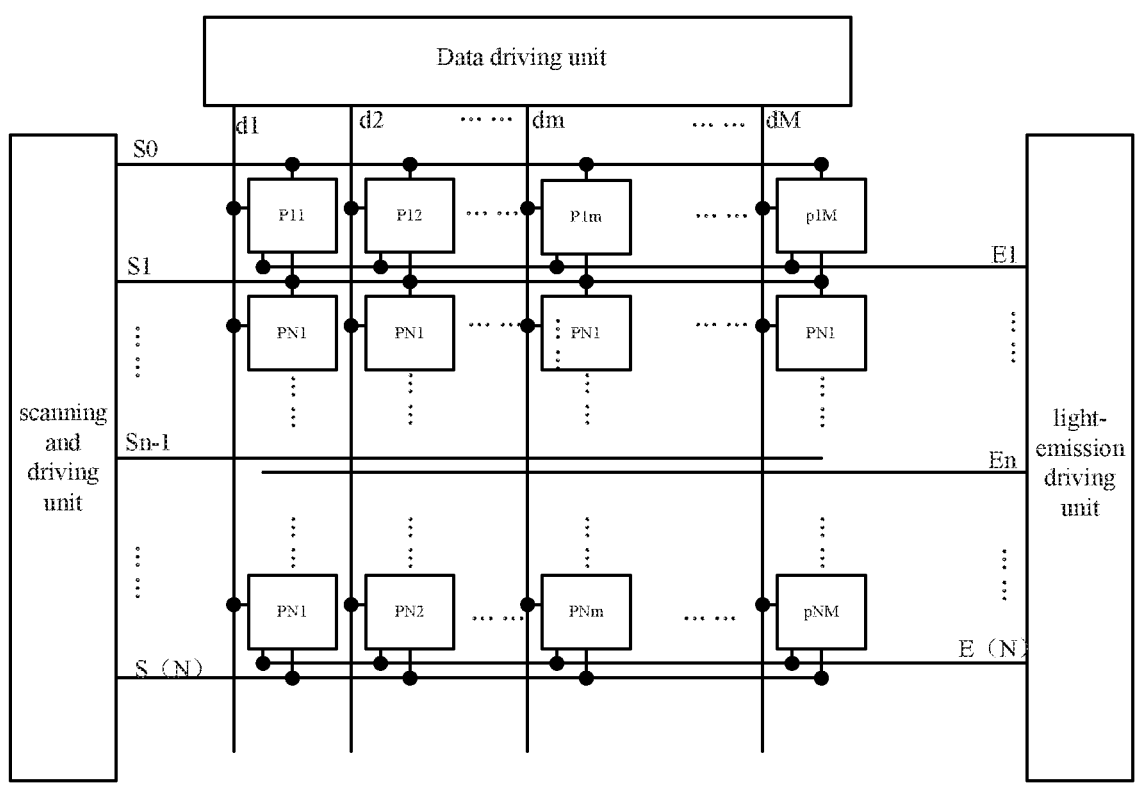
FIG. 14 is a schematic structural diagram of a display according to an embodiment of the present disclosure.

Based on the same technical idea, an embodiment of the present disclosure further provides a display adopting the pixel circuit provided by any of the above embodiments. FIG. 14 is a schematic structural diagram of a display provided by an embodiment of the present disclosure. In FIG. 14, the display includes a N×M pixel circuit array. The scanning and driving unit generates scanning signals S0, S1, S2, . . . SN, and Sn is a scanning signal inputted into the $n^{th}$ row pixels by the scanning and driving unit, n=1, 2, . . . , N; the data driving unit generates a data signal data including M data signals d1, d2, . . . dM corresponding to M columns of pixels respectively, dm is a data signal data of the $m^{th}$ column pixel, m=1, 2, . . . M; and the light-emission driving unit generates first control signals E1, E2, . . . , EN, En is the first control signal inputted into the $n^{th}$ row pixels by the light emitting driving unit, n=1, 2, . . . N.

To sum up, the embodiments of the present disclosure provide a common-gate transistor, a pixel circuit, a driving method, and a display, including: a first doped region, a second doped region, a third doped region, a fourth doped region, and a fifth region. The second doped region, the third doped region, the fourth doped region, and the fifth doped region are indirectly communicated through the first doped region, and the second doped region, the third doped region, the fourth region, the fifth doped region and the first doped region are all hetero-doped. With the above scheme, two groups of doped regions among the second doped region, the third doped region, the fourth doped region, and the fifth doped region constitute one group of source doped regions or one group of drain doped regions of the mirror transistor, the first doped region in the middle serves as the gate doped region, so that two transistors in the mirror transistor share one gate doped region, which can save one gate doped region; in addition, because the gates of the two transistors are the same gate doped region, the electrical parameters of the gates of the two transistors can be made closer, and the cascode effect of the transistor is more ideal.

Although the embodiments of the present disclosure have been described, those skilled in the art can make additional changes and modifications to these embodiments once they learn the basic inventive concept of the present disclosure. Therefore, the appended claims are intended to be interpreted as including the embodiments and all changes and modifications that fall within the scope of the present disclosure.

It will be apparent to those skilled in the art that various modifications and variations can be made in the present disclosure without departing from the spirit and scope of the disclosure. Thus, if these modifications and variations of the present disclosure fall within the scope of the claims of the present disclosure and their equivalents, the present disclosure is also intended to include these modifications and variations.

What is claimed is:

1. A pixel circuit, comprising a common-gate transistor, wherein the common-gate transistor comprises:
    a first doped region, a second doped region, a third doped region, a fourth doped region and a fifth doped region;
    wherein the second doped region, the third doped region, the fourth doped region and the fifth doped region are indirectly communicated through the first doped region, and the second doped region, the third doped region, the fourth doped region, the fifth doped region, and the first doped region are hetero-doped respectively,
    wherein the first doped region serves as a common-gate doped region of two transistors of the common-gate transistor, any two of the second doped region, the third doped region, the fourth doped region, and the fifth doped region are combined to constitute a source doped region and a drain doped region of one of the two transistors, and the other two of the second doped region, the third doped region, the fourth doped region, and the fifth doped region are combined to constitute a source doped region and a drain doped region of the other of the two transistors,
    wherein the second doped region, the third doped region, the fourth doped region, and the fifth doped region combines into at least two groups of doped regions that have centrosymmetric position structures and identical electrical properties, and the doped regions having centrosymmetric position structures and identical electrical properties constitute a group of source doped regions or a group of drain doped regions of the common-gate transistor; and
    wherein the second doped region, the third doped region, the fourth doped region, and the fifth doped region have identical electrical properties, and two groups of combined doped regions are centrosymmetrically distributed with respect to the first doped region,
    wherein the pixel circuit further comprises: a compensation unit, a driving unit, a light emitting unit, a capacitor, and an external power supply;
    the compensation unit is electrically connected to the driving unit through a first node; the external power supply, the driving unit, and the light emitting unit are connected in series in sequence; and the capacitor is located between the first node and the external power supply;
    the compensation unit externally connects a data signal and a first scanning signal, and the compensation unit is configured to set a voltage of the first node to a first voltage under an effect of the first scanning signal, the first voltage being a voltage obtained by compensating a voltage of the data signal by a compensation transistor in the compensation unit;
    the capacitor is configured to keep the voltage of the first node as the first voltage; and
    the driving unit externally connects a first control signal, and the driving unit is configured to generate a driving current to drive the light emitting unit to emit light according to the first control signal; the driving current is obtained according to the first voltage, the external power supply and a threshold voltage of a driving transistor in the driving unit; and the driving transistor and the compensation transistor are the common-gate transistor.

2. The pixel circuit according to claim 1, further comprising: an initialization unit;
    wherein the initialization unit is located between the first node and the light emitting unit, and the initialization unit externally connects a second scanning signal and an initialization voltage; and
    the initialization unit is configured to initialize the first node and the light emitting unit using the initialization voltage under a control of the second scanning signal.

3. A method for driving a pixel circuit, applied to a pixel circuit, wherein the pixel circuit comprises a common-gate transistor, and the common-gate transistor comprises:
    a first doped region, a second doped region, a third doped region, a fourth doped region and a fifth doped region;
    wherein the second doped region, the third doped region, the fourth doped region and the fifth doped region are indirectly communicated through the first doped region, and the second doped region, the third doped region, the fourth doped region, the fifth doped region, and the first doped region are hetero-doped respectively, wherein the first doped region serves as a common-gate doped region of two transistors of the common-gate transistor, any two of the second doped region, the third doped region, the fourth doped region, and the fifth doped region are combined to constitute a source doped region and a drain doped region of one of the two transistors, and the other two of the second doped region, the third doped region, the fourth doped region, and the fifth doped region are combined to constitute a source doped region and a drain doped region of the other of the two transistors, wherein the second doped region, the third doped region, the fourth doped region, and the fifth doped region combines into at least two groups of doped regions that have centrosymmetric position structures and identical electrical properties, and the doped regions having centrosymmetric position structures and identical electrical properties constitute a group of source doped regions or a group of drain doped regions of the common-gate transistor; and wherein the second doped region, the third doped region, the fourth doped region, and the fifth doped region have identical electrical properties, and two groups of combined doped regions are centrosymmetrically distributed with respect to the first doped region, wherein the pixel circuit further comprises: a compensation unit, a driving unit, a light emitting unit, a capacitor, and an external power supply;

the compensation unit is electrically connected to the driving unit through a first node; the external power supply, the driving unit, and the light emitting unit are connected in series in sequence; and the capacitor is located between the first node and the external power supply;

the compensation unit externally connects a data signal and a first scanning signal, and the compensation unit is configured to set a voltage of the first node to a first voltage under an effect of the first scanning signal, the first voltage being a voltage obtained by compensating a voltage of the data signal by a compensation transistor in the compensation unit;

the capacitor is configured to keep the voltage of the first node as the first voltage; and the driving unit externally connects a first control signal, and the driving unit is configured to generate a driving current to drive the light emitting unit to emit light according to the first control signal; the driving current is obtained according to the first voltage, the external power supply and a threshold voltage of a driving transistor in the driving unit; and the driving transistor and the compensation transistor are the common-gate transistor, wherein the method comprises:

in a data writing stage, controlling the first scanning signal to turn on the compensation unit, then the compensation unit setting the voltage of the first node to the first voltage; controlling the first control signal to turn off the driving unit to make the light emitting unit not emit light; and keeping the voltage of the first node as the first voltage by the capacitor; wherein the first voltage is a voltage obtained by compensating a voltage of the data signal through a compensation transistor in the compensation unit; and in a light emitting phase, controlling the first scanning signal to turn off the compensation unit, and controlling the first control signal to turn on the driving unit, then the driving unit generating a driving current to drive the light emitting unit to emit light; the driving current being obtained according to the first voltage, the external power supply and the threshold voltage of the driving transistor in the driving unit; and the capacitor being in a holding state.

4. The method according to claim 3, wherein the pixel circuit further comprises: an initialization unit;

wherein the initialization unit is located between the first node and the light emitting unit, and the initialization unit externally connects a second scanning signal and an initialization voltage; and the initialization unit is configured to initialize the first node and the light emitting unit using the initialization voltage under a control of the second scanning signal, wherein before the data writing phase, the method further comprises:

in an initialization phase, controlling the second scanning signal to turn on the initialization unit, then the initialization unit initializing the first node and the light emitting unit by using the initialization voltage, the capacitor keeping the initialization voltage; and controlling the first scanning signal to turn off the compensation unit and controlling the first control signal to turn off the driving unit.

5. The method according to claim 4, wherein in the data writing stage, the method further comprises: controlling the second scanning signal to turn off the initialization unit; and in the light emitting stage, the method further comprises: controlling the second scanning signal to turn off the initialization unit.

* * * * *